United States Patent
Shen et al.

(10) Patent No.: US 8,781,770 B2
(45) Date of Patent: Jul. 15, 2014

(54) METHOD AND SYSTEM FOR ESTIMATING BATTERY PERCENTAGE

(75) Inventors: Jean-Lieh Shen, Taoyuan (TW);
Chih-Chung Teng, Taoyuan (TW);
Tsung-Yuan Yang, Taoyuan (TW);
Chih-Hsiung Chang, Taoyuan (TW);
Kuei-Yuan Lai, Taoyuan (TW)

(73) Assignee: HTC Corporation, Taoyuan County (TW)

( * ) Notice: Subject to any disclaimer, the term of this patent is extended or adjusted under 35 U.S.C. 154(b) by 792 days.

(21) Appl. No.: 12/941,302

(22) Filed: Nov. 8, 2010

(65) Prior Publication Data
US 2011/0125434 A1     May 26, 2011

(30) Foreign Application Priority Data
Nov. 25, 2009 (TW) .............................. 98140216 A

(51) Int. Cl.
*G01R 31/36* (2006.01)

(52) U.S. Cl.
USPC .............. 702/63; 702/57; 702/64; 702/65; 702/130; 702/189; 320/137; 320/144

(58) Field of Classification Search
USPC .......... 702/63, 57, 64, 65, 130, 189; 320/137, 320/144
See application file for complete search history.

(56) References Cited

U.S. PATENT DOCUMENTS

| | | | |
|---|---|---|---|
| 5,061,898 A * | 10/1991 | Oram et al. | 324/427 |
| 5,459,390 A * | 10/1995 | Tomazic | 320/134 |
| 5,596,262 A | 1/1997 | Boll | |
| 5,606,243 A * | 2/1997 | Sakai et al. | 320/134 |
| 5,612,608 A | 3/1997 | Ishiguro et al. | |
| 6,057,688 A | 5/2000 | Kawai et al. | |
| 6,157,169 A * | 12/2000 | Lee | 320/132 |
| 6,201,373 B1* | 3/2001 | Arai et al. | 320/132 |
| 6,515,452 B2* | 2/2003 | Choo | 320/132 |
| 6,967,466 B2* | 11/2005 | Koch | 320/132 |
| 8,099,180 B2* | 1/2012 | Schoch | 700/31 |
| 2001/0040443 A1* | 11/2001 | Suzuki et al. | 320/134 |
| 2002/0196026 A1* | 12/2002 | Kimura et al. | 324/426 |
| 2003/0117143 A1* | 6/2003 | Okada | 324/428 |
| 2003/0193318 A1* | 10/2003 | Ozawa et al. | 320/132 |
| 2004/0157113 A1* | 8/2004 | Klang | 429/50 |
| 2006/0022676 A1* | 2/2006 | Uesaka et al. | 324/429 |
| 2006/0158155 A1* | 7/2006 | Tamezane et al. | 320/132 |
| 2006/0220619 A1* | 10/2006 | Namba et al. | 320/149 |

FOREIGN PATENT DOCUMENTS

| | | |
|---|---|---|
| EP | 0628833 A1 | 12/1994 |
| JP | 2006-098134 A | 4/2006 |

* cited by examiner

*Primary Examiner* — Hyun Park
(74) *Attorney, Agent, or Firm* — Rabin & Berdo, P.C.

(57) ABSTRACT

A method and a system for estimating a battery percentage are provided. The method includes the following steps. A coulomb counter calculated battery index (CCBI) relating to an accumulated amount of current flowing out of a battery is obtained. A battery voltage curve tracer calculated battery index (VCBI) relating to a temperature, an output voltage of the battery, and a current flowing out of the battery is obtained. A modified calculated battery index (MCBI) ranging between the CCBI and the VCBI is generated according to the CCBI and the VCBI.

16 Claims, 3 Drawing Sheets

METHOD AND SYSTEM FOR ESTIMATING BATTERY PERCENTAGE

This application claims the benefit of Taiwan application Serial No. 98140216, filed Nov. 25, 2009, the subject matter of which is incorporated herein by reference.

BACKGROUND OF THE INVENTION

1. Field of the Invention

The invention relates in general to an estimation method and an estimation system, and more particularly to a method and a system for estimating a battery percentage.

2. Description of the Related Art

In a portable electronic device, it is an important issue to let the user know the battery percentage. In general, there are many methods of calculating the battery percentage of the portable electronic device. The first method is to use a percentage gauge integrated circuit (IC) disposed on a battery protection circuit board or a circuit board of the electronic device. Although this percentage gauge IC can precisely measure the battery percentage, its cost is relatively high.

The second method is a method for measuring the battery percentage designed according to the concept of a battery voltage curve tracer. Because the hardware which this method needs is simpler, the cost thereof is far less than that of the first method using the percentage gauge IC. However, the second method has poor precision. Thus, it is an important subject in the industry to design a low-cost and highly precise method of estimating the battery percentage.

SUMMARY OF THE INVENTION

The invention is directed to a method and a system for estimating a battery percentage in a low-cost and high-precision manner.

According to a first aspect of the present invention, a method for estimating a battery percentage is provided. The method includes the following steps. A coulomb counter calculated battery index (CCBI) is obtained. The CCBI relates to an accumulated amount of current flowing out of a battery. A battery voltage curve tracer calculated battery index (VCBI) is obtained. The VCBI relates to a temperature, an output voltage of the battery, and a current flowing out of the battery. A modified calculated battery index (MCBI) is generated according to the CCBI and the VCBI. The MCBI ranges between the CCBI and the VCBI.

According to a second aspect of the present invention, a system for estimating a battery percentage is provided. The system includes a coulomb counter calculated battery index (CCBI) generator, a battery voltage curve tracer calculated battery index (VCBI) generator and an adjusting device. The CCBI generator generates a CCBI, which relates to an accumulated amount of current flowing out of a battery. The VCBI generator generates a VCBI, which relates to a temperature, an output voltage of the battery, and a current flowing out of the battery. The adjusting device generates a modified calculated battery index (MCBI) according to the CCBI and the VCBI. The MCBI ranges between the CCBI and the VCBI.

The invention will become apparent from the following detailed description of the preferred but non-limiting embodiments. The following description is made with reference to the accompanying drawings.

DETAILED DESCRIPTION OF THE INVENTION

Figure 1:
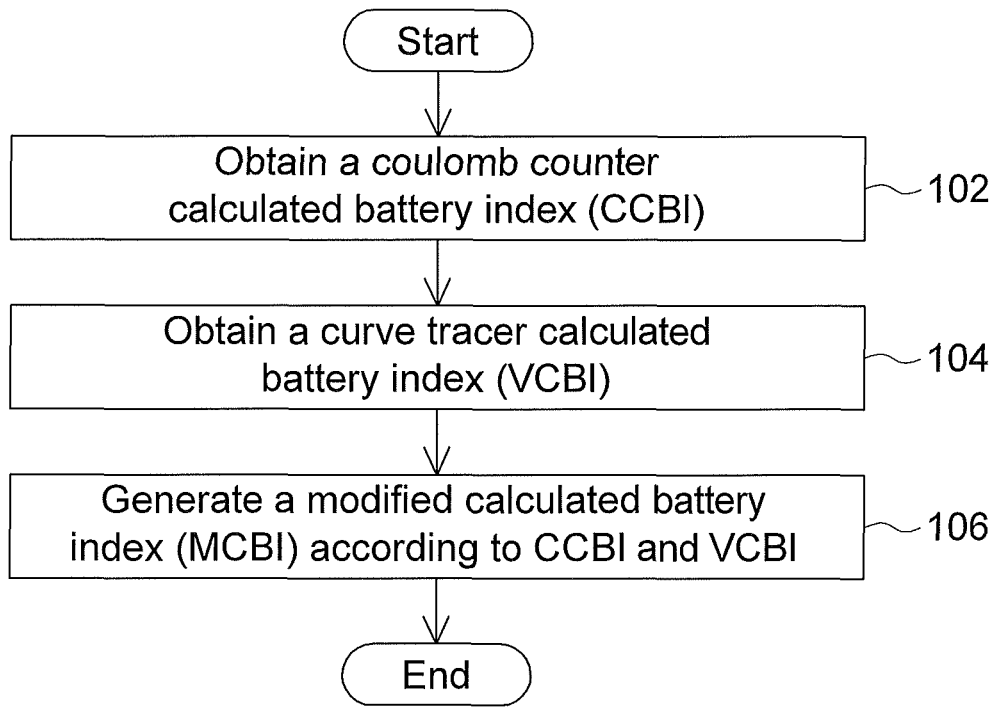
FIG. 1 is a flow chart showing a method for estimating a battery percentage according to an embodiment of the invention.

FIG. 1 is a flow chart showing a method for estimating a battery percentage according to an embodiment of the invention. First, as shown in step 102, a coulomb counter calculated battery index (CCBI) is obtained. The CCBI relates to an accumulated amount of current flowing out of a battery. Next, as shown in step 104, a battery voltage curve tracer calculated battery index (VCBI) is obtained. The VCBI relates to a temperature, an output voltage of the battery, and a current flowing out of the battery. Thereafter, as shown in step 106, a modified calculated battery index (MCBI), ranging between the CCBI and the VCBI, is generated according to the CCBI and the VCBI. When the current is under-estimated or over-estimated, the CCBI and the VCBI have complementary property. Thus, the battery percentage corresponding to the MCBI generated according to the CCBI and the VCBI in this embodiment can advantageously become more precise without increasing the cost.

Figure 2:
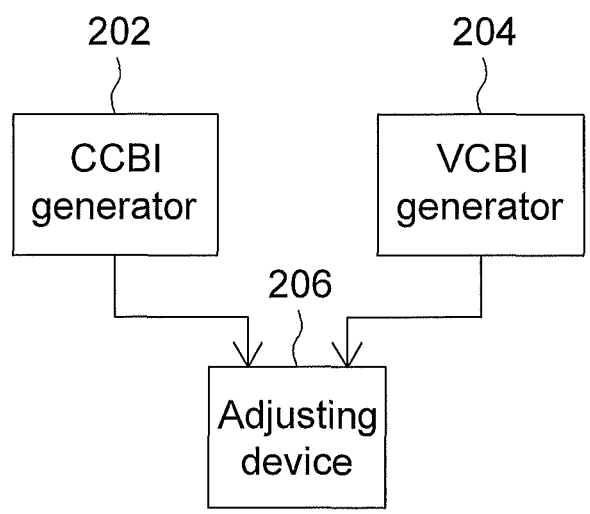
FIG. 2 is a block diagram showing an estimation system for executing the estimation method of FIG. 1.

This embodiment further provides a system for estimating a battery percentage. FIG. 2 is a block diagram showing an estimation system 200 for executing the estimation method of FIG. 1. As shown in FIG. 2, the estimation system 200 includes a CCBI generator 202, a VCBI generator 204 and an adjusting device 206. The CCBI generator 202 generates the CCBI in the step 102. The VCBI generator 204 generates the VCBI in the step 104. The adjusting device 206 generates the MCBI in the step 106 according to the CCBI and the VCBI.

The CCBI of the step 102 is obtained by subtracting an accumulated value of products of time periods and the currents, flowing out of the battery, from an original battery percentage of the battery, for example. In practice, the CCBI may be obtained by using a coulomb counter or by software estimation. The VCBI of the step 104 is obtained by referring to a relationship curve of a voltage versus a battery percentage of a battery at the temperature based on the output voltage of the battery, for example.

Figure 3:
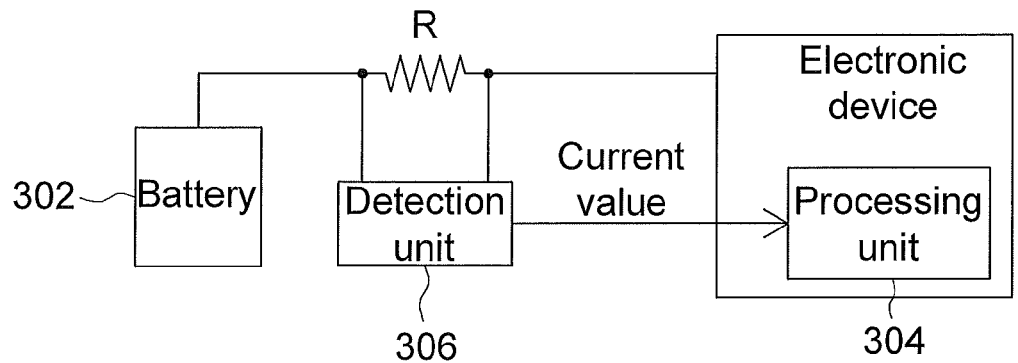
FIG. 3 is a block diagram showing an example of a CCBI generator of FIG. 2.

The methods of generating the CCBI and the VCBI in the steps 102 and 104 will be described in the following examples, and the embodiment is not limited to these examples. FIG. 3 is a block diagram showing an example of the CCBI generator 202 of FIG. 2. As shown in FIG. 3, the current outputted from a battery 302 flows through a resistor R and is then outputted to an electronic device. A detection unit 306 detects a voltage across the resistor R, and outputs a current value, corresponding to the current flowing through the resistor R, to a processing unit 304. The current value is generated according to the resistance of the resistor R and the voltage across the resistor R. The processing unit 304 then calculates the CCBI according to the current value.

Figure 4:
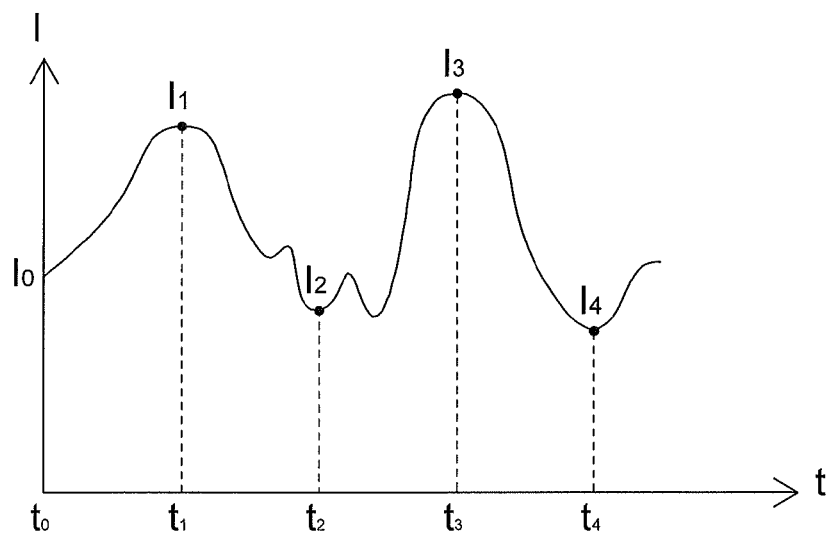
FIG. 4 shows one example of the waveform of the current I outputted from a battery.

FIG. 4 shows one example of the waveform of the current value I outputted from the battery 302. At time points $t_0, t_1, t_2, t_3$ and $t_4$, the detection unit 306 detects the voltages across the resistor R, and calculates the current values as $I_0, I_1, I_2, I_3$ and $I_4$, respectively. The current values $I_0$, $I_1$, $I_2$, $I_3$ and $I_4$, correspond to the currents flowing out of the battery at time points $t_0$, $t_1$, $t_2$, $t_3$ and $t_4$. The processing unit 304 regards the product of the current value and the time period between two neighboring time points as the battery percentage flowing out of the battery 302 in this time period. In this case, the consumed battery percentage of the battery 302 from the time points $t_0$ to $t_4$ is calculated to be $I_0(t_1-t_0)+I_1(t_2-t_1)+I_2(t_3-t_2)+I_3(t_4-t_3)$, for example. Thus, the CCBI at the time point $t_4$ is obtained by subtracting the accumulated value $I_0(t_1-t_0)+I_1(t_2-t_1)+I_2(t_3-t_2)+I_3(t_4-t_3)$ of the products of the time periods and the current values from the original battery percentage of the battery at the time point $t_0$.

The other method for generating the CCBI is the software estimation. In practice, the processing unit 304 refers to a look-up table which records the stored software and the corresponding amount of current consumed by the electronic device when the software being executed in this electronic device. The processing unit 304 then calculates the battery percentage consumed by the executed software according to the product of the time period of executing the software and the corresponding amount of current. Thus, the CCBI can be obtained by subtracting the battery percentages consumed by all of the executed software from the original battery percentage of the battery 302.

Figure 5:
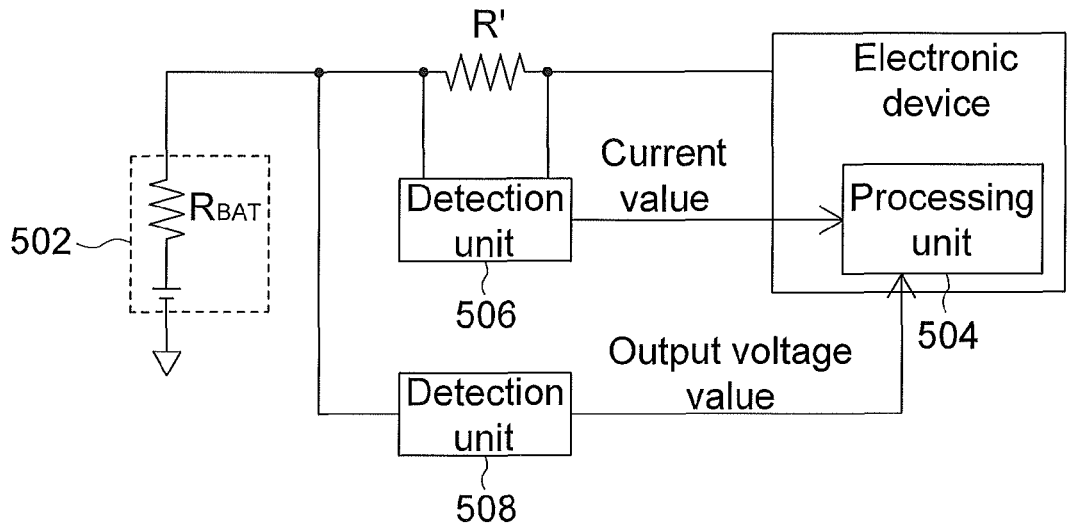
FIG. 5 is a block diagram showing an example of a VCBI generator of FIG. 2.
Figure 6:
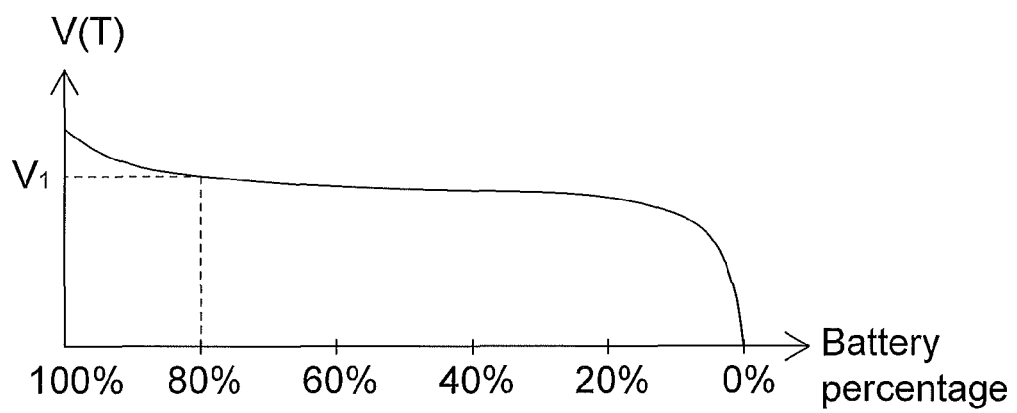
FIG. 6 is a relationship curve showing the relationship one example of the relationship between the voltage V(T) and the battery percentage of a battery for generating the VCBI at a certain temperature.

FIG. 5 is a block diagram showing an example of the VCBI generator 204 of FIG. 2. FIG. 6 is a relationship curve showing one example of the relationship between the voltage V(T) and the battery percentage of the battery for generating the VCBI at a certain temperature. A detection unit 508 detects an output voltage of a battery 502, and a detection unit 506 detects the voltage across the resistor R'. The detection units 508 and 506 respectively output the output voltage value of the battery 502 and the current value corresponding to the current flowing through the resistor R' to a processing unit 504. At this time, the processing unit 504 calculates the open circuit voltage of the battery according to the output voltage value, the current value, and the known internal resistance $R_{BAT}$ of the battery 502. The processing unit 504 regards the obtained open circuit voltage as the battery voltage V, and refers to the relationship curve of FIG. 6, which corresponds to the relationship curve of the open circuit voltage versus the battery percentage of the battery 502 to obtain the battery percentage of the battery 502. For example, if the open circuit voltage of the battery 502 is $V_1$, it is obtained that the battery percentage is 80% at this time according to the relationship curve of FIG. 6.

However, errors between the actual battery percentage and the CCBI and errors between the actual battery percentage and the VCBI do exist. For example, according to some experiment, the current value $I_A$ of the resistor R, which is outputted from the detection unit 306, is compared with the current value $I_B$ of the resistor R, which is measured in a more precise way by a more precise instrument in the laboratory. If $I_A$ is smaller than $I_B$ (this is the situation where the current is under-estimated), it is obtained, according to the experiment, that the battery percentage is over-estimated according to the obtained CCBI. That is, the battery percentage represented by the CCBI is higher than the actual battery percentage.

In another case, the current value $I_C$ of the resistor R', which is outputted from the detection unit 506, may be compared with the current value $I_D$ of the resistor R', which is measured in a more precise way by a more precise instrument in the laboratory. If $I_C$ is lower than $I_D$ (this is the situation where the current is under-estimated), it is obtained, according to the experiment, that the battery percentage is under-estimated according to the obtained VCBI. That is, the battery percentage represented by the VCBI is lower than the actual battery percentage.

Oppositely, if $I_A$ is higher than $I_B$ (this is the situation where the current is over-estimated), then the battery percentage is under-estimated according to the obtained CCBI. If $I_C$ is higher than $I_D$ (this is the situation where the current is over-estimated), then the battery percentage is over-estimated according to the obtained VCBI.

The above-mentioned methods for obtaining the CCBI and the VCBI have the complementary property when the current is over-estimated or under-estimated. So, this embodiment, in which the step 106 of FIG. 1 is performed to generate the MCBI ranging between the CCBI and the VCBI, has the advantage of obtaining more precise battery percentage.

The step 106 of FIG. 1 will be further described in detail. The MCBI further relates to the difference between the CCBI and the VCBI. For example, the MCBI may be substantially equal to the CCBI minus a compensation value, which relates to the difference between the CCBI and the VCBI. The MCBI may alternatively be substantially equal to the VCBI minus a compensation value, which also relates to the difference between the CCBI and the VCBI. This compensation value is a function of the difference between the CCBI and the VCBI. When the difference between the CCBI and the VCBI becomes greater, the compensation value becomes greater.

A function will be described as an example in the following.

$$\text{MCBI} = \text{CCBI} - F \quad (1),$$

and $$F = (\text{CCBI} - \text{VCBI}) * [|\text{CCBI} - \text{VCBI}|^N] * (10^{-3}) * C \quad (2),$$

where F is a compensation value, and N and C are parameters for adjusting the value of F. |CCBI−VCBI| is the absolute value of the difference between the CCBI and the VCBI, and N and C may be finely tuned according to the properties of the used electronic device and the desired effect.

N is preferably the value greater than or equal to zero. If N is equal to 1, then F relates to the square of (CCBI−VCBI). Thus, it is possible to obtain the effect that the compensation value becomes greater as the difference between the CCBI and the VCBI becomes greater.

N may also be equal to 0. When N is equal to 0, F linearly relates to (CCBI−VCBI).

The parameter "$10^{-3}$" in Equation (2) makes F fall within a certain range, and may also be replaced with other value.

Although the compensation value F relates to the power of N of (CCBI−VCBI) in Equation (2), the compensation value F may also be other function of (CCBI−VCBI) as long as the compensation value can become greater as the difference between the CCBI and the VCBI becomes greater.

The method and the system for estimating the battery percentage according to the embodiment of the invention has the advantage of estimating the battery percentage more precisely. In addition, the cost can be saved because the design of the required hardware is not complicated. In addition, this embodiment can achieve the precision, which is near the precision achieved by the conventional percentage gauge IC, under the low-cost condition, so that the product competitiveness of the method and the system is relatively high.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for estimating a battery percentage, the method comprising the steps of:
   obtaining a coulomb counter calculated battery index (CCBI), which relates to an accumulated amount of current flowing out of a battery;
   obtaining a battery voltage curve tracer calculated battery index (VCBI), which relates to a temperature, an output voltage of the battery, and a current flowing out of the battery; and
   generating a modified calculated battery index (MCBI), using a processing unit, according to the CCBI and the VCBI, wherein the MCBI relates to a difference between the CCBI and the VCBI and ranges between the CCBI and the VCBI;
   wherein the MCBI is substantially equal to the CCBI minus a compensation value, and the compensation value relates to a difference between the CCBI and the VCBI.

2. The method according to claim 1, wherein the CCBI is obtained by subtracting an accumulated value of products of time periods and the current values from an original battery percentage of the battery, the current values correspond to the currents flowing out of the battery at a plurality of time points.

3. The method according to claim 1, wherein the CCBI is obtained by using a coulomb counter.

4. The method according to claim 1, wherein the CCBI is obtained by software estimation.

5. The method according to claim 1, wherein the VCBI is obtained by referring to a relationship curve of a voltage versus a battery percentage of a battery at the temperature based on the output voltage of the battery.

6. The method according to claim 1, wherein the compensation value relates to a power of N of the difference between the CCBI and the VCBI, wherein N is a value greater than or equal to zero.

7. The method according to claim 1, wherein the compensation value becomes greater as the difference between the CCBI and the VCBI becomes greater.

8. A method for estimating a battery percentage, the method comprising the steps of:
   obtaining a coulomb counter calculated battery index (CCBI), which relates to an accumulated amount of current flowing out of a battery;
   obtaining a battery voltage curve tracer calculated battery index (VCBI), which relates to a temperature, an output voltage of the battery, and a current flowing out of the battery; and
   generating a modified calculated battery index (MCBI), using a processing unit, according to the CCBI and the VCBI, wherein the MCBI relates to a difference between the CCBI and the VCBI and ranges between the CCBI and the VCBI;
   wherein the MCBI is substantially equal to the VCBI minus a compensation value, and the compensation value relates to a difference between the CCBI and the VCBI.

9. A system for estimating a battery percentage, the system comprising:
   a coulomb counter calculated battery index (CCBI) generator for generating a CCBI, which relates to an accumulated amount of current flowing out of a battery;
   a battery voltage curve tracer calculated battery index (VCBI) generator for generating a VCBI, which relates to a temperature, an output voltage of the battery, and a current flowing out of the battery; and
   an adjusting device for generating a modified calculated battery index (MCBI) according to the CCBI and the VCBI, wherein the MCBI relates to a difference between the CCBI and the VCBI and ranges between the CCBI and the VCBI;
   wherein the MCBI is substantially equal to the CCBI minus a compensation value, and the compensation value relates to a difference between the CCBI and the VCBI.

10. The system according to claim 9, wherein the CCBI is obtained by subtracting an accumulated value of products of time periods and the current values from an original battery percentage of the battery, the current values correspond to the currents flowing out of the battery at a plurality of time points.

11. The system according to claim 9, wherein the CCBI is obtained by using a coulomb counter.

12. The system according to claim 9, wherein the CCBI is obtained by software estimation.

13. The system according to claim 9, wherein the VCBI is obtained by referring to a relationship curve of a voltage versus a battery percentage of a battery at the temperature based on the output voltage of the battery.

14. The system according to claim 9, wherein the compensation value relates to a power of N of the difference between the CCBI and the VCBI, wherein N is a value greater than or equal to zero.

15. The system according to claim 9, wherein the compensation value becomes greater as the difference between the CCBI and the VCBI becomes greater.

16. A system for estimating a battery percentage, the system comprising:
   a coulomb counter calculated battery index (CCBI) generator for generating a CCBI, which relates to an accumulated amount of current flowing out of a battery;
   a battery voltage curve tracer calculated battery index (VCBI) generator for generating a VCBI, which relates to a temperature, an output voltage of the battery, and a current flowing out of the battery; and
   an adjusting device for generating a modified calculated battery index (MCBI) according to the CCBI and the VCBI, wherein the MCBI relates to a difference between the CCBI and the VCBI and ranges between the CCBI and the VCBI;
   wherein the MCBI is substantially equal to the VCBI minus a compensation value, and the compensation value relates to a difference between the CCBI and the VCBI.

* * * * *